United States Patent
Chattopadhyay et al.

(10) Patent No.: US 7,295,406 B2
(45) Date of Patent: Nov. 13, 2007

(54) NARROW TRACK EXTRAORDINARY MAGNETO RESISTIVE [EMR] DEVICE

(75) Inventors: Amitava Chattopadhyay, San Jose, CA (US); Robert E. Fontana, Jr., San Jose, CA (US); Bruce Alvin Gurney, San Rafael, CA (US); Stefan Maat, San Jose, CA (US); Ernesto E. Marinero, Saratoga, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 454 days.

(21) Appl. No.: 10/897,454

(22) Filed: Jul. 22, 2004

(65) Prior Publication Data

US 2006/0018054 A1  Jan. 26, 2006

(51) Int. Cl.
 *G11B 5/39* (2006.01)
(52) U.S. Cl. ..................................... 360/313
(58) Field of Classification Search ............. 360/313, 360/326
 See application file for complete search history.

(56) References Cited

U.S. PATENT DOCUMENTS

| | | | |
|---|---|---|---|
| 6,707,122 B1 * | 3/2004 | Hines et al. | 257/421 |
| 6,930,862 B2 * | 8/2005 | Gill et al. | 360/313 |
| 2004/0218309 A1 * | 11/2004 | Seigler | 360/313 |

OTHER PUBLICATIONS

S.A. Solin, Tineke Thio, D.R. Hines, J.J. Heremans, "Enhanced Room-Temperature Geometric Magnetoresistance in Inhomogeneous Narrow-Gap Semiconductors," Sep. 1, 2000, Science, vol. 289, 1530, www.sciencemag.org.

S.A. Solin, D.R. Hines and A.C.H. Rowe, J.S. Tsai and Yu. A. Pashkin, "Nanoscopic Magnetic Field Sensor Based on Extraordinary Magnetoresistance,"2003, J. Vac. Sci. Technol.B21(6), Nov./Dec. 2003, 2002.

S.A. Solin, D.R. Hines, J.S. Tsai, Yu. A. Pashkin, S.J. Chung, N. Goel, and M.B. Santos, "Room Temperature Extraordinary Magnetoresistance of Nonmagnetic Narrow-Gap Semiconductor/Metal Composites: Application to Read-Head Sensors for Ultrahigh-Density Magnetic Recording." Jan. 2002, IEEE Transactions On Magnetics, vol. 38, No. 1, 89.

C.H. Moller, O. Kronenwerth, D. Grundler, W. Hansen, Ch. Heyn, and D. Heitmann "Extraordinary Magnetoresistance Effect in a Microstructured Metal-Semiconductor Hybrid Structure," May 27, 2002, Applied Physics Letters, vol. 80, No. 21, 3988.

C.H. Moller, D. Grundler, O. Kronenwerth, Ch. Heyn, and D. Heitmann, "Effect of the Interface Resistance on the Extraordinary Magnetoresistance of Semiconductor/Metal Hybrid Structures," 2003, JOSC, 16, 195.

(Continued)

*Primary Examiner*—Julie Anne Watko
(74) *Attorney, Agent, or Firm*—Zilka-Kotab, PC (57) ABSTRACT

An extraordinary magnetoresistive sensor having optimal magnetic sensitivity capable of reading a very narrow and short magnetic bit. The sensor includes a layer of semiconductor layer and a layer of electrically conductive material. The first and second leads are electrically connected with an edge of the semiconductor material, one of the leads being located a distance inward from an end of the sensor. The sensor also includes first and second voltage leads, located on either side of and close to one of the current leads.

22 Claims, 6 Drawing Sheets

OTHER PUBLICATIONS

S.A. Solin, D.R. Hines and A.C.H. Rowe, J.S. Tsai and Yu. A. Pashkin, S.J. Chung, N. Goel, and M.B. Santos, "Nonmagnetic Semiconductors as Read-Head Sensors for Ultra-High-Density Magnetic Recording," May 27, 2002, Applied Physics Letters, vol. 80, No. 21, 4012.

Yu. V. Sharvin, "A Possible Method for Studying Fermi Surfaces," 1965, Sov. Phys., JETP 21, 655.

Matthias Holz, Oliver Kronenwerth and Dirk Grundler, "Enhanced Magnetoresistance of Semiconductor-Metal Hybrid Structures," Jul. 2004, 27th International Conference on the Physics of Semiconductors, Flagstaff, AZ.

T. Zhou, D.R. Hines and S.A. Solin, "Extraordinary Magnetoresistance in Externally Shunted Van Der Pauw Plates," APL, 78, 667, 2001.

M. Holz, O. Kronenwerth and D. Grundler, "Magnetoresistance of Semiconductor-metal Hybrid Structures: The Effects of Material Parameters and Contact Resistance," PRB 67, 195312, 2003.

J. Moussa, L.R. Ram-Mohan, A.C. Rowe and S.A. Solin, "Response of an Extraordinary Magnetoresistance Read Head to a Magnetic Bit," JAP, 94, 1110, 2003.

* cited by examiner

NARROW TRACK EXTRAORDINARY MAGNETO RESISTIVE [EMR] DEVICE

FIELD OF THE INVENTION

The present invention relates to magnetoresistive sensors and more particularly to an Extraordinary Magnetoresistive (EMR) sensor having maximized magnetoresistance (dRvv/Rii) and an extremely narrow track width.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic bits to and reading magnetic bits from the rotating disk. The read and write heads are connected to processing circuitry that operates according to a computer program to implement the writing and reading functions.

In recent read head designs a spin valve sensor, also referred to as a giant magnetoresistive (GMR) sensor has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal resulting in a low resistance state and when the magnetizations of the pinned and free layer are antiparallel, scattering is maximized resulting in a high resistance state. Changes in scattering alter the resistance of the spin valve sensor in proportion to $\cos \theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause voltage changes that are detected and processed as playback signals.

In the ever increasing push for increased data rate and data capacity, engineers and scientists have continually found ways to make magnetoresistive sensors ever smaller. However such sensors are rapidly approaching a limit beyond which further reduction in size cannot be achieved. This is due in part to thermally induced fluctuations of the magnetization direction of the magnetic layers and in particular on the free layer magnetization in a Giant Magnetoresistance (GMR) or similar sensor. Thermal agitation becomes more severe as the sensor becomes smaller and the volume of the magnetic layers decreases accordingly. The magnetization fluctuation within the layers results in an increased sensor noise. Another form of noise that limits the extension of some sensors to small dimensions is present in GMR devices operated with the current perpendicular to the plane of the layers called spin torque noise that also contributes to the noise and reduces the signal to noise ratio of such devices. Other types of sensors that use magnetic layers have been investigated, including magnetic tunnel junction (MTJ) heads. Just like GMR heads, the MTJ heads exhibit mag-noise and spin torque noise, both of which increase as device dimensions are made smaller. MTJ sensors also exhibit shot noise. With decreasing dimension eventually these noise sources will increase sufficiently to render many types of sensor unusable. Therefore, there is a need for a sensor that does not require the use of magnetic layers, and more specifically does not employ a magnetic free layer.

In order to develop such a non-magnetic magnetoresistive sensor, researchers have investigated what have been referred to as extraordinary magnetoresistive (EMR) sensors (EMR). EMR is described by T. Zhou et al., "Extraordinary magnetoresistance in externally shunted van der Pauw plates", *Appl. Phys. Lett.*, Vol. 78, No. 5, 29 Jan. 2001, pp. 667-669. An EMR sensor for read-head applications is described by S. A. Solin et al., "Nonmagnetic semiconductors as read-head sensors for ultra-high-density magnetic recording", *Appl. Phys. Lett.*, Vol. 80, No. 21, 27 May 2002, pp. 4012-4014.

An EMR sensor operates based on the Hall Effect, which has been known for about a hundred years. When a charge carrier, such as an electron is moving through a material in the presence of both an electrical field and a magnetic field, the electron will be subject to a force along the electric field and a force given by the cross product of its velocity and the magnetic field. Thus the magnetic field tends to deflect the movement of carrier away from the direction of its motion. In some Hall devices that operate in a steady state, the carriers flow at an angle (called the Hall angle) with respect to the electric field given by $\tan(\theta)=(Mu)\times(B)$, where Mu is the material's mobility and B is the magnetic field. Some semiconductors can be made with Mu as large as about 60,000 $cm^2$/Vs (=6/Tesla). At a magnetic field of 1 Tesla a Hall angle of 81 degrees can be achieved between the electric field and current flow resulting in a substantial change in the direction of motion of the carriers in a magnetic field.

An EMR device in its simplest terms can be constructed as a conductive material, such as a metal, formed adjacent to a semiconductor. When a pair of current leads are connected to a surface of the semiconductor at either end of the semiconductor, the current will tend to flow through the semiconductor to the more conductive metal (located opposite the current leads). The current will then travel readily through the more conductive material and then back through the semiconductor to the other current lead. When a magnetic field is applied perpendicular to the plane of the device, the Hall effect will deflect the electrons so that some of them travel a longer distance through the more highly resistive semiconductor thus increasing the overall resistance of the device. This results in an increased resistance, which can be read as a voltage difference across the semiconductor, measured by voltage leads located on the same surface as the current leads. Thus the magnetoresistance of the device can be defined as the change in voltage between the voltage leads dVvv divided by the voltage applied to the current leads Vii, or $$MR=dVvv/Vii.$$

Additionally, resistances for the voltage leads Rvv and current leads Rii can be defined by dividing through by whatever current is flowing through the structure, so that $$MR=dVvv/Vii=dRvv/Rii.$$

DESCRIPTION OF THE PRIOR ART

Figure 1:
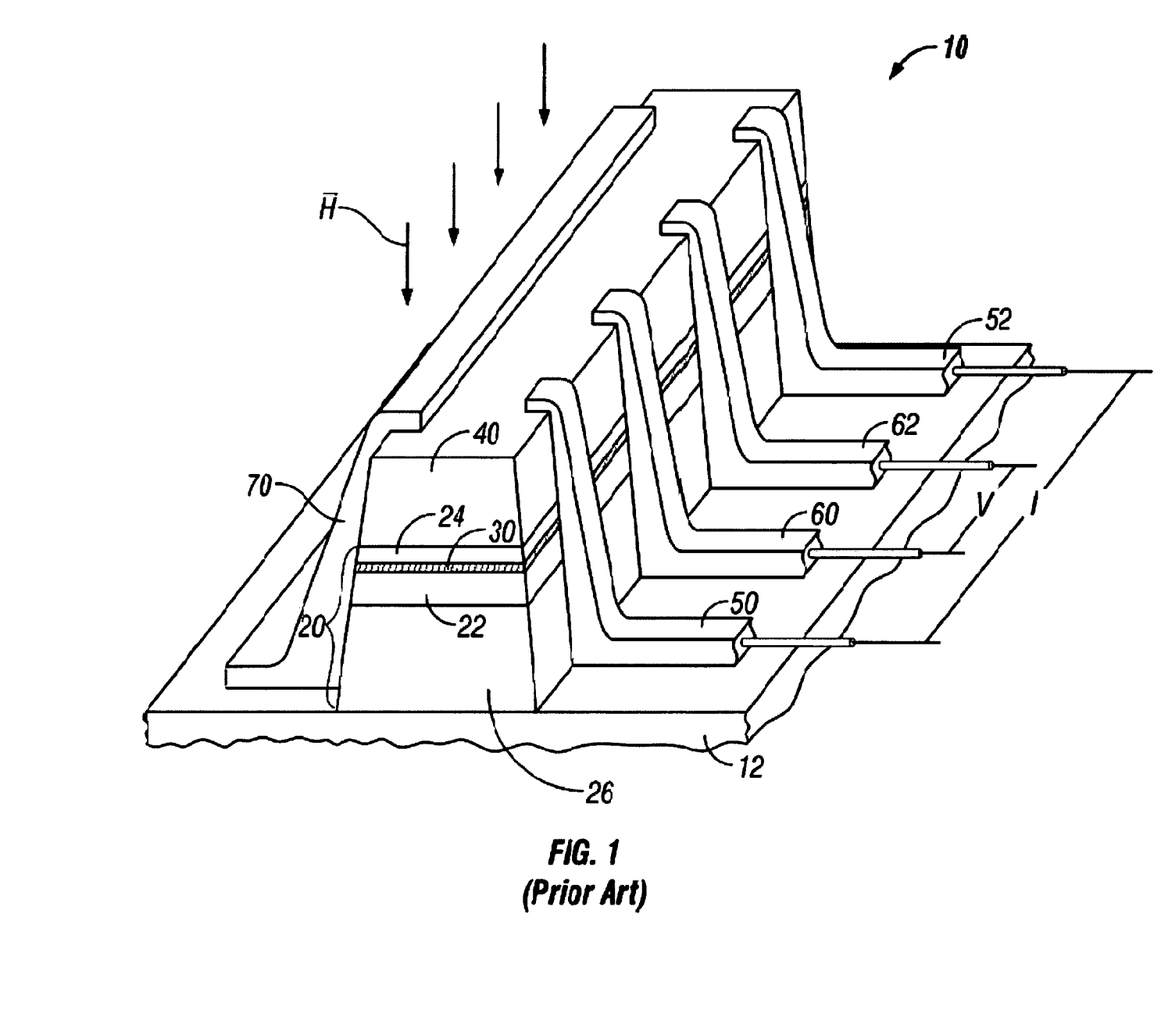
FIG. 1 is an isometric view of a prior art EMR sensor.

FIG. 1 is an isometric view of a prior art EMR sensor 10. The EMR sensor 10 includes a structure 20 that is a III-V heterostructure formed on a semiconducting substrate 12 such as GaAs. However, the EMR sensor described in this invention is not restricted to III-V semiconductor materials. For example, it may also be formed on the basis of silicon. The heterostructure 20 includes a first layer 22 of semiconducting material having a first band-gap, a second layer 30 of semiconducting material formed on top of the first layer 22 and having a second band gap smaller than the first band gap, and a third layer 24 of semiconducting material formed on top of the second layer 30 and having a third band gap greater than the second band gap. The materials in first and third layers 22, 24 may be similar or identical. An energetic potential well (quantum well) is created by the first, second and third semiconducting material layers due to the different band-gaps of the different materials. Thus carriers can be confined inside layer 30, which is considered the EMR active film in the sensor 10.

The first layer 22 is typically formed on top of a buffer layer 26 that may be one or more layers. The buffer layer 26 comprises several periods of a superlattice structure that function to prevent impurities present in the substrate from migrating into the functional layers 22, 24 and 30. In addition, the buffer layer 26 is chosen to accommodate the typically different lattice constants of the substrate 12 and the functional layers of the heterostructure 20 to thus act as a strain relief layer between the substrate and the functional layers.

One or more doping layers are incorporated into the semiconducting material in the first layer 22, the third layer 24, or both layers 22 and 24, and spaced apart from the boundary of the second and third semiconducting materials. The doped layers provide electrons (if n-doped) or holes if (p-doped) to the quantum well. The electrons or holes are concentrated in the quantum well in the form of a two-dimensional electron-gas or hole-gas, respectively.

As described in the previously-cited references, the layers 22/30/24 may be a $Al_{0.09}In_{0.91}Sb/InSb/Al_{0.09}In_{0.91}Sb$ heterostructure grown onto a semi-insulating GaAs substrate 12 with a buffer layer 26 in between. InSb is a narrow band-gap semiconductor. Narrow band-gap semiconductors typically exhibit high electron mobility, since the effective electron mass is greatly reduced. Typical narrow band-gap materials are InSb and InAs. For example, the room temperature electron mobility of InSb and InAs are 60,000 $cm^2/Vs$ and 35,000 $cm^2/Vs$, respectively.

The bottom $Al_{0.09}In_{0.91}Sb$ layer 22 formed on the buffer layer 26 has a thickness in the range of approximately 1-3 microns and the top $Al_{0.09}In_{0.91}Sb$ layer 24 has a thickness in the range of approximately 10 to 1000 nm, typically 50 nm. The n-doping layers incorporated into layer 22 or 24 have a thickness from one monolayer (delta-doped layer) up to 10 nm. The n-doping layer is spaced from the InSb/$Al_{0.09}In_{0.91}Sb$ boundaries of first and second or second and third semiconducting materials by a distance of 10-300 Å. N-doping is preferred, since electrons typically have higher mobility than holes. The typical N-dopant is silicon with a concentration in the range of 1 to $10^{19}/cm^3$. The deposition process for the heterostructure 20 is preferably molecular-beam-epitaxy, but other epitaxial growth methods can be used.

A capping layer 40 is formed over the heterostructure 20 to protect the device from corrosion. The capping layer is formed of an insulating material such as oxides or nitrides of aluminum or silicon (e.g., $Si_3N_4$, $Al_2O_3$) or a non-corrosive semi-insulating semiconductor.

Two current leads 50, 52 and two voltage leads 60, 62 are patterned over one side of the EMR structure 20 so that they make electrical contact with the quantum well. A metallic shunt 70 is patterned on the side opposite the current and voltage leads of the EMR structure 20 so that it makes electrical contact with the quantum well. The applied magnetic field H, i.e., the magnetic field to be sensed, is shown by the arrows and is normal to the plane of the films in the EMR structure 20. The leads typically comprise metallic contacts, for example Au, AuGe, or Ge diffused into the device. The leads are typically formed after formation of the capping layer 40, and sometimes after removal of some of the capping layer material.

While such EMR devices provide the advantage of sensing a magnetic field without the use of a magnetic layer such as a free layer, EMR devices have not yet been used in disk drive devices. This is because other magnetoresistive sensor such as GMR sensor have provided sufficient sensitivity and bit resolution for bit sizes used so far. But as bit sizes narrow GMR and other sensors lose SNR making an alternative necessary.

Therefore, there remains a strong felt need for a device that can sense a magnetic field without the use of magnetic layers (such as a magnetic free layer) in the device itself. Such a device would need to be very sensitive having a very high dRvv/Rii. Such a device would also have to be capable of reading a magnetic signal having a very narrow track width and very short bit length.

SUMMARY OF THE INVENTION

The present invention provides an extraordinary magnetoresistance sensor having optimized dRvv/Rii and having the capability of reading a very narrow bit width and bit length. The sensor includes a layer of electrically conductive material formed adjacent to and contacting a layer of semiconductor material. First and second current leads are electrically connected with an edge of the semiconductor material. First and second voltage leads are also connected with the edge of the semiconductor material layer, the voltage leads being located on either side of and very close to one of the current leads. In other words, one of the current leads is located between the two voltage leads.

The first current lead is located at one end of the sensor, the second current lead located between the two voltage leads is located some distance from the same end of the sensor, such as about ⅔ of the distance from one end of the sensor to the other. Modeling has shown that the location of the voltage lead, current lead, voltage lead triad along the edge of the sensor greatly affects the dRvv/Rii of the sensor, with a maximum dRvv/Rii being achieved when the triad is located about ⅔ of the distance from one end to the other.

Furthermore, the sensor exhibits very high dRvv/Rii when the voltage leads are located at either side of the second current lead. This dRvv/Rii is maximized when the voltage leads are located as close as possible to the second current lead without causing electrical shorting among the leads.

Locating the voltage leads close to one another as described above, advantageously allows the sensor to read a very narrow track width. The width of a magnetic bit read by the sensor is essentially just the distance between the voltage leads, although the sensitive region of the device will extend somewhat beyond the separation of the leads.

Modeling results have shown that the sensitivity of the EMR device is localized around the region between the voltage leads in both the longitudinal direction as well as in the track width direction. A sensor according to the present invention can, therefore, be used in a data recording system having a very large number of bits per inch of signal track. A sensor according to the present invention is also particularly suitable for use in perpendicular recording systems, which are expect to make up the vast majority of future magnetic data storage systems.

In addition to magnetic recording systems, a sensor according to the present invention is also useful in a magnetic imaging device such as a scanning magnetometer. Such a magnetometer includes a chuck for holding a workpiece and an actuator that is capable of moving the sensor in a rasterized pattern over the workpiece to read the magnetic topography of the workpiece. A sensor according to the present invention may also be useful in other devices requiring a high sensitivity, high resolution sensor. These and other aspects and advantages of the invention will become apparent upon further reading of the detailed description.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

BEST MODE FOR CARRYING OUT THE INVENTION

The following description is of the best embodiments presently contemplated for carrying out this invention. This description is made for the purpose of illustrating the general principles of this invention and is not meant to limit the inventive concepts claimed herein.

Figure 2:
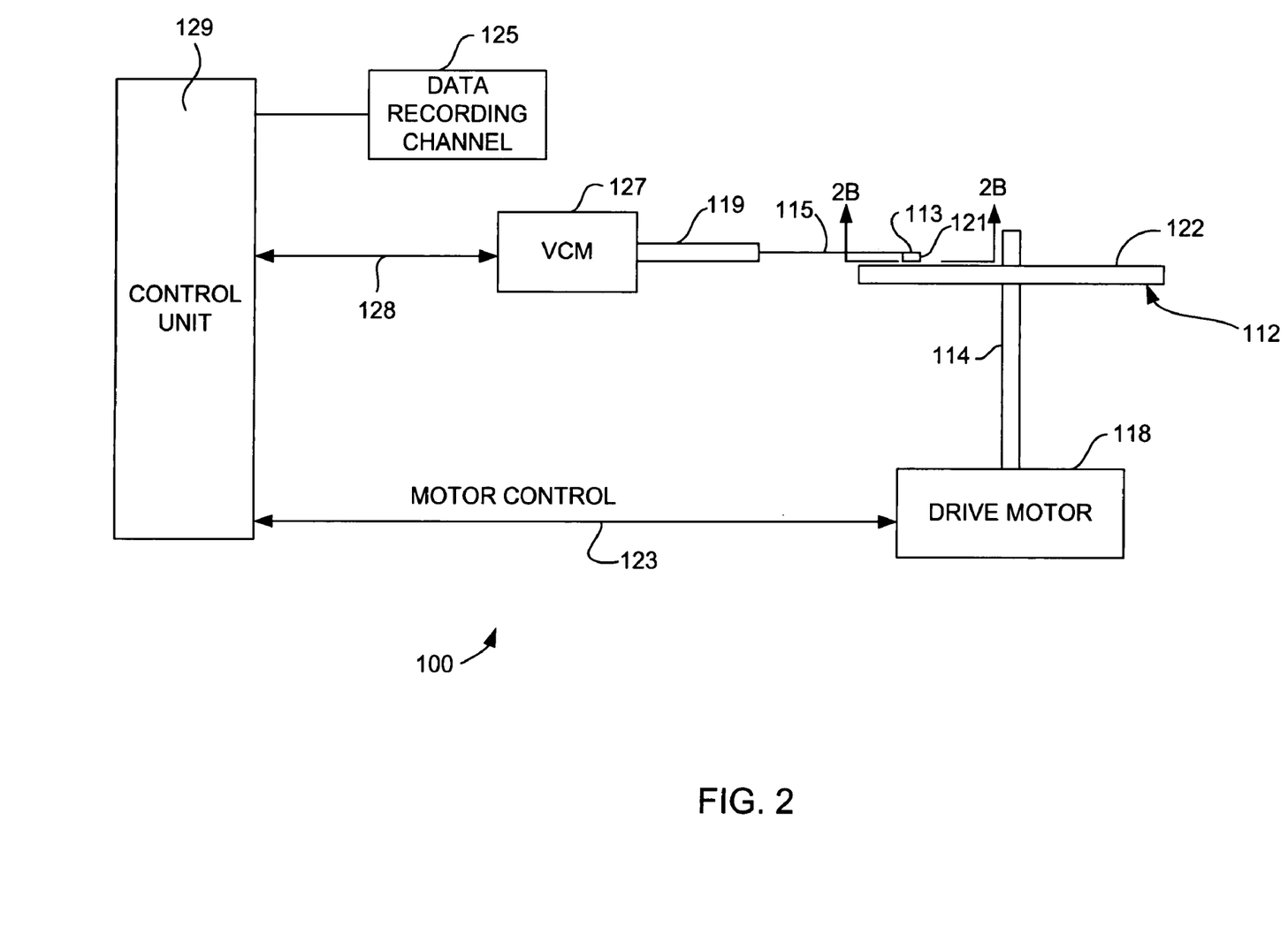
FIG. 2 is a schematic illustration of a disk drive system in which the invention might be embodied.

Referring now to FIG. 2, there is shown a disk drive 100 embodying this invention. As shown in FIG. 2, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 2 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 3:
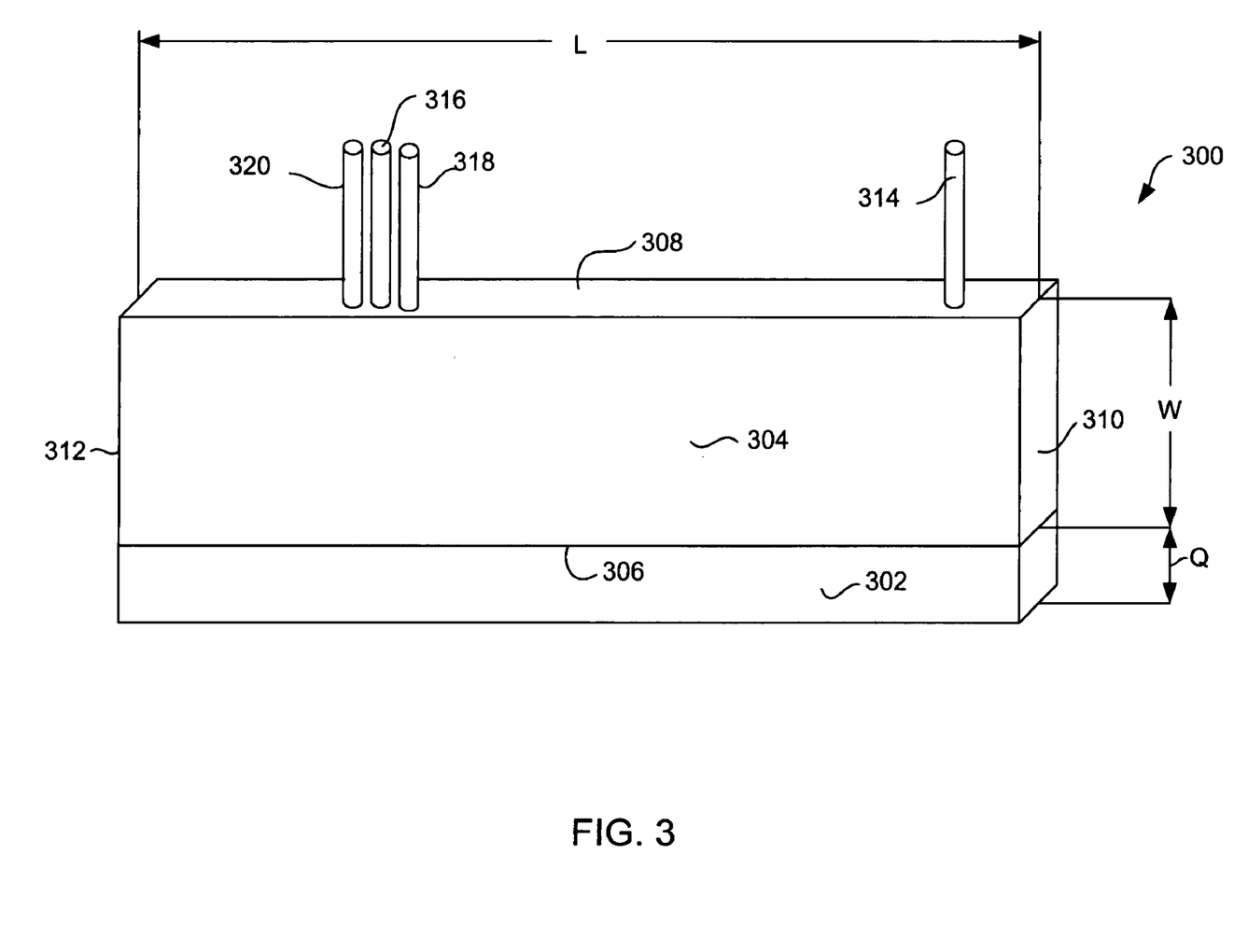
FIG. 3 is an isometric view of an EMR sensor according to an embodiment of the present invention.

With reference now to FIG. 3, an Extraordinary Magnetoresistive (EMR) sensor 300 according to an embodiment of the invention includes a layer of electrically conductive material 302. The sensor 300 also includes a layer of semiconductor material 304 that has an edge that contacts the conductive layer 302 at an interface 306 and has an edge surface 308 opposite the interface 306. The semiconductor layer terminates at first and second ends 310, 312 defining a length L and has a width W. The layer of conductive material 302 preferably has the same length L as the semiconductor layer 304 and has a width Q.

The semiconductor layer 304 generally is a semiconductor heterostructure comprising a 2D electron or hole gas as described in the prior art. More specifically, a high mobility semiconductor such as InSb or InAs is employed. However, lower mobility materials may be appropriate for devices with L smaller than approximately the mean free path of the carriers. The electrically conductive layer 302 can be for example a metal, and can be any conducting metal, such as Au, that achieves an ohmic or nearly ohmic contact with the semiconductor. The metal conductivity should exceed that of the semiconductor in order to achieve a large magnetoresistance dRvv/Rii.

A contact resistance between the semiconductor layer 304 and the metal layer 302, will likely exist due to the band structure mismatch of the two materials and any interdiffusion that has occurred. The contact resistance may be in the range of 1E-8 ohm cm2 to 1E-6 ohm cm$^2$. With continued reference to FIG. 3, the sensor 300 includes first and second current leads 314, 316, that are electrically connected with the edge surface 308 of the semiconductor layer 304 opposite the interface 306. The first current lead 314 is located near an end 310 of the semiconductor layer 304, whereas the second current lead 316 is located at about 2L/3 from the same end 310. One of the leads, such as 314 is an input lead supplying current into the sensor 300, while the other lead 316 is an output lead conducting the electrical current back out of the sensor. However, the polarity of the leads 314, 316 is not critical, and lead 314 could be the output lead while lead 316 could be the input lead.

Figure 4:
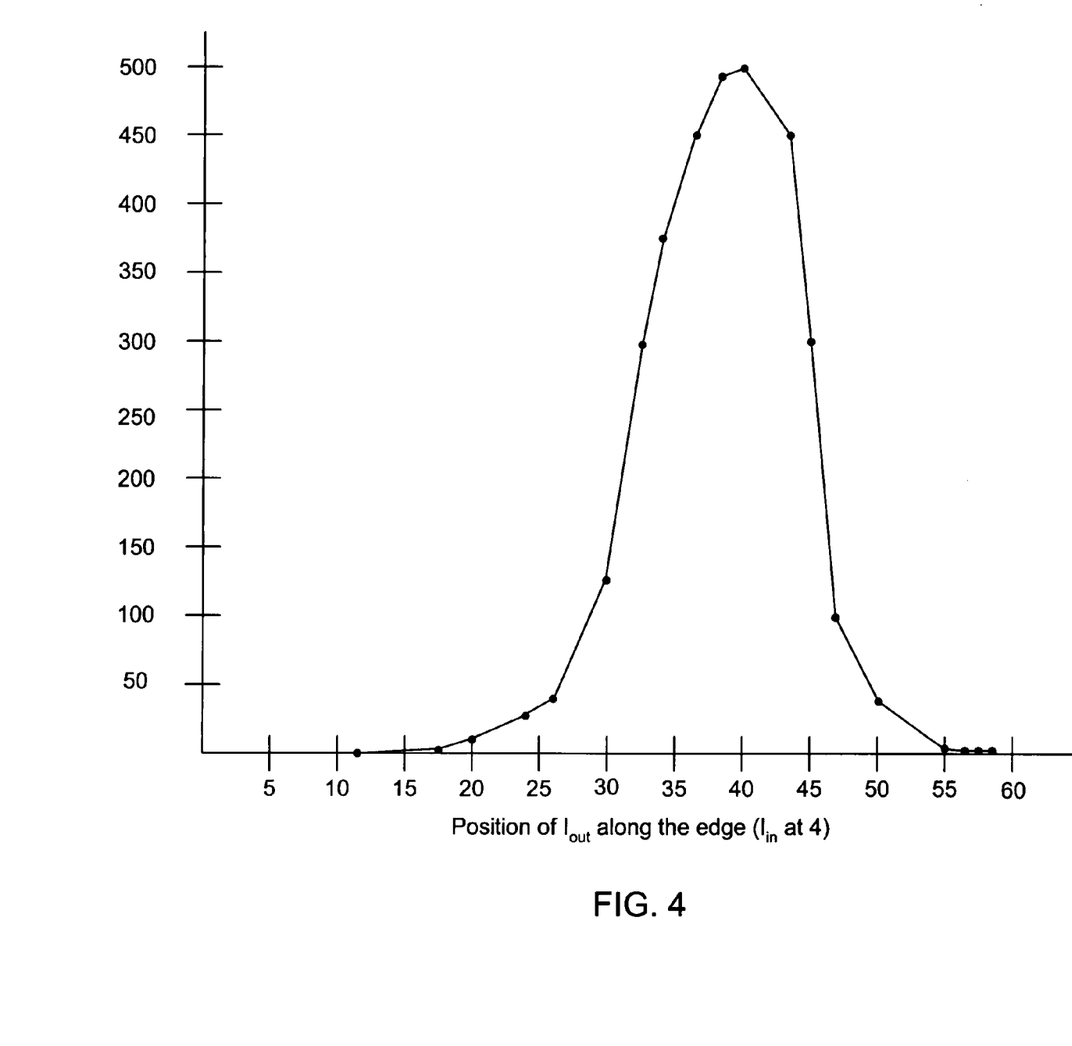
FIG. 4 is a graphical representation of the relationship between and current lead location.

We have found that locating the second current lead 316 some distance away from the end 312 results in a very large increase in magnetoresistance. This increase is maximized when the lead 316 is located about ⅔ of the distance from the opposite end 310 of the sensor 300. This arrangement is fundamentally different from the arrangement of current leads use in prior art devices, wherein the current leads were each positioned at or near the ends of the device. FIG. 4 illustrates the relationship between signal strength (shown in arbitrary units) with respect to current lead placement. The length of the sensor can be seen as being divided into 60 equal increments. It can be seen from FIG. 4, that the maximum signal strength is achieved when one of the current leads is located about ⅔ of the distance along the sensor edge, or at "40" along the x axis of the graph. Although the positions of the current leads specify one of the leads being $I_{out}$ and the other being $I_{in}$, as mentioned above, the polarity is not critical and can be reversed.

With reference again to FIG. 3, the sensor 300 further includes first and second voltage leads 318, 320, electrically connected with the edge surface 308. As can be seen, the voltage leads are located at either side of the second current lead 316 and are located very close to the current lead 316. In fact the distance between the voltage leads 318, 320 are located as close to one another as possible without causing an electrical short between one of the voltage leads 318, 320 and the current lead 316. The distance between the voltage leads 318, 320 defines the track width of the sensor 300, and since a narrow track width is desired for maximum data density, the close spacing between the voltage leads 318, 320 provide exceptional signal resolution, and very small track width. The distance between the voltage leads 318, 320, therefore, is preferably not greater than 30 nm and is more preferably not greater than 20 nm. Of course, electrical isolation of the voltage leads 318, 320 from the current lead 316 must be maintained and further advances in lithographic and other manufacturing processes may allow the leads to be constructed even closer together.

In addition to exceptional signal resolution and narrow track width, the above described position of the voltage leads provides greatly increased magnetoresistance. As discussed above a magnetoresistive sensor detects magnetic field as a change in resistance of the sensor in response to the presence of a magnetic field. These changes in resistance are detected as voltages changes across the first and second voltage leads.

Figure 5A:
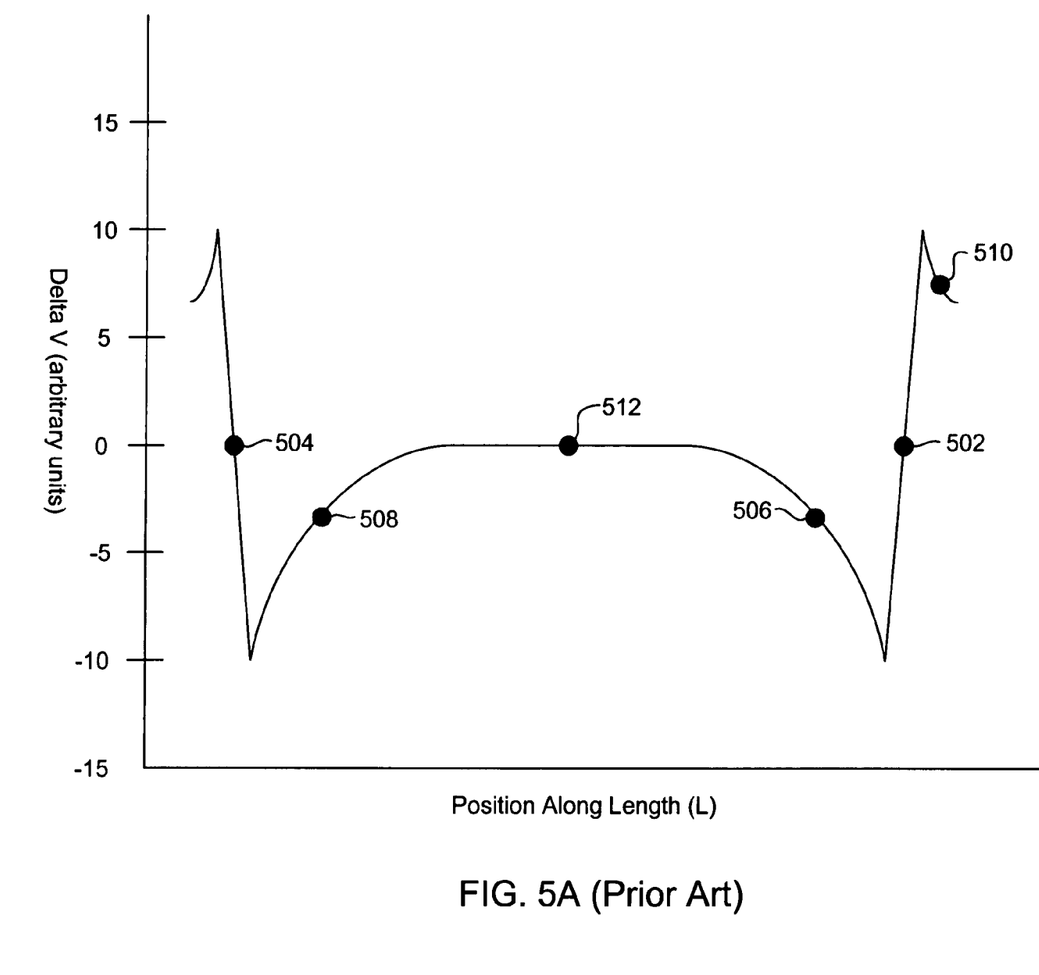
FIGS. 5A and 5B are graphical representations of the relationship between voltage and lead position along a length of a sensor according to the prior art 5A and according to an embodiment of the invention 5B.
Figure 5B:
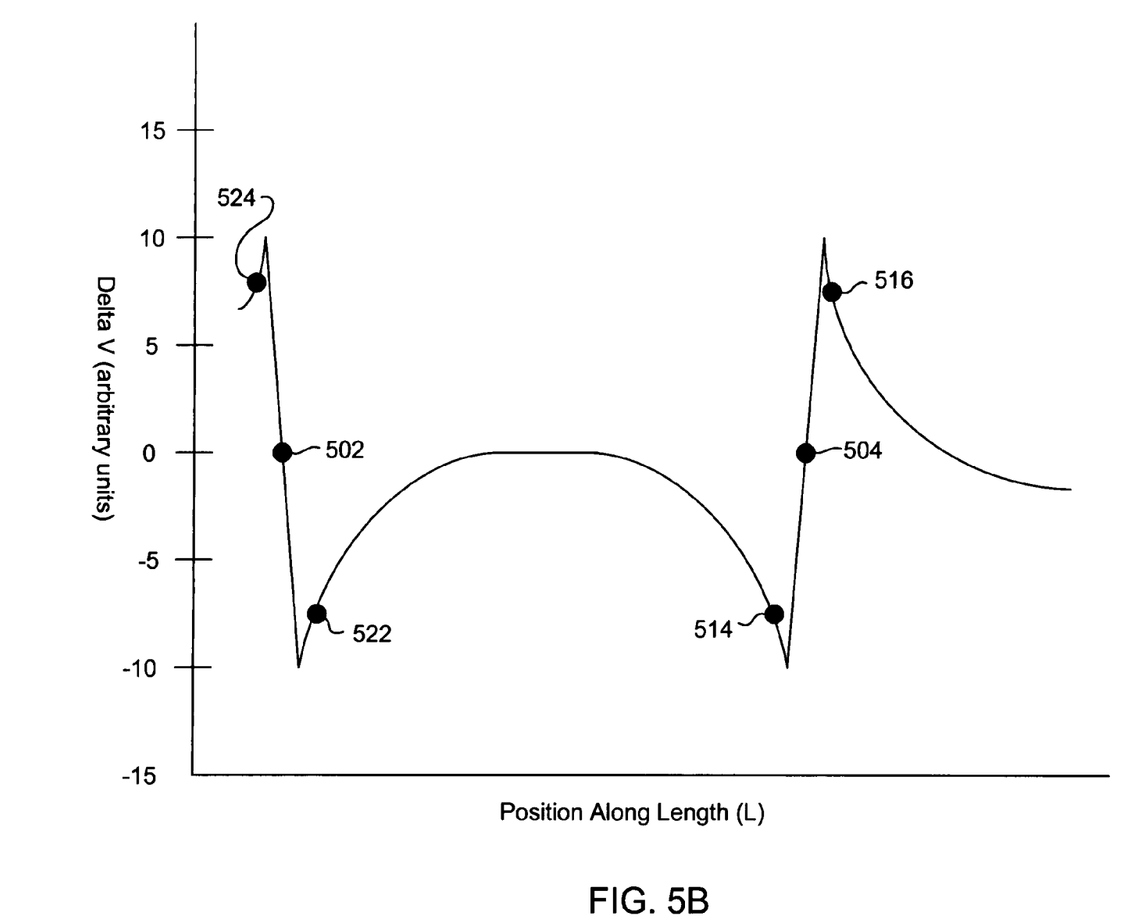

To better understand the exceptional dRvv/Rii performance provided by the lead configuration of the present invention, consider FIGS. 5A and 5B. Remembering that it is the voltage difference between two points on the sensor in response to a magnetic field that we are interested in measuring, FIGS. 5A and 5B illustrate the change in resistance at locations across the length of the sensor. Locations 502 and 504 indicate the location of the first and second current leads 314, 316 on the sensor 300 (FIG. 3). With reference to FIG. 5A which illustrates prior art arrangements of voltage leads relative to current leads, one can see that if the voltage leads are both located at just inside the first and second current leads at locations 506, 508 very little difference in voltage will be detected. If one were to measure the voltage at a location just outside of one of the current leads, location 510 and also at the midpoint between the two current leads, location 512, a slightly larger voltage change would be detected.

However, with reference now to FIG. 5B which illustrates a possible voltage lead current lead arrangement according to the present invention, if one were to measure the voltage at either side of just one of the current leads, such as at positions 514 and 516, an extremely large voltage difference can be detected. The voltage could also be measured at points 522 and 524 at either side of the other current lead located at position 504, which would also result in a large voltage difference. It should also be pointed out that, as discussed above, one of the current leads is located at a position 504 that is about ⅔ of the distance along the edge of the device as measured from one end to another. This placement of the voltage leads maximizes the signal and does so over a very small lateral distance, resulting in high spatial resolution. The placement of the voltage leads 318, 320 on either side of and very close to one of the current leads 316, therefore, provides two enormous benefits. First it provides a very large magnetoresistive signal. Second it allows the sensor 300 to have an extremely narrow track width, since the track width is only the distance between the voltage leads 318, 320.

Locating the triad of voltage/current/voltage leads 318, 316, 320 about ⅔ of the distance along the length (L) of the sensor provides a third advantage by further increasing the magnetoresistance of the sensor as discussed above. The distance between the voltage leads 318, 320 is only limited by the lithographic capabilities of forming the leads 316, 318, 320. Furthermore, the sensor is scalable in that the sensor can be made a small as the lithographic and other available manufacturing processes will allow, as long as the relative proportions of the sensor remain essentially the same.

With continued reference to FIG. 5B, while the configuration of voltage leads at either side of a single current lead provides excellent signal resolution, there may be situations where such a tight signal resolution may not be needed or desired. For example, there are many applications in which a sensor is needed to sense the presence of a magnetic field. In such a case the voltage leads could be located adjacent to two different current leads such as at positions 524 and 514, or at positions 522 and positions 516. While this configuration of leads would not provide the signal resolution of the previously discussed arrangements, it would provide excellent sensitivity to magnetic fields, and could prove to be much easier and less expensive to manufacture.

With reference again to FIG. 3, in operation, a current is caused to flow from one of the current leads 314 to the other current lead 316. In the absence of a magnetic field the resulting electrical current will flow from the lead 314 directly through the semiconductor material to the conductive layer 302. It will flow through the conductive layer relatively very easily and then back through the semiconductor 304 to the other lead 316. The resistance in the absence of a magnetic field will then be essentially twice the resistance through a width W of the semiconductor material.

In the presence of a magnetic field, the Hall effect on the charge carriers causes more of the current to flow through the semiconductor material 304 without passing through the electrically conductive layer 302. Since the semiconductor layer has a much higher resistance than the electrically conductive layer 304 this will result in a much higher resistance through the sensor, which can be read as a signal as described above.

In order to achieve desired exceptional performance, the semiconductor layer 304 preferably has proportions such that W/L is between 1/60 and 1/5 and can be about 1/10. The distance between the voltage leads 318, 320 for magnetic read sensor applications should be chosen to be about the same as the data track width and is preferably L/15. The voltage leads 318, 320 are preferably each separated from the current lead by a distance of about L/30 or less. As the signal detected across the voltage probes depends on the spacing between the voltage leads 318, 320, this spacing should not be greater than 33% of the track width (1.33×L/15).

However, the minimum lithographically attainable feature size and the finite width of the voltage and current leads result in being able to locate the voltage leads 318 and 320 only a minimum distance away from the second current lead 316 in order to avoid shunting. A typical voltage edge to current edge separation possible today is about 30 nm, making the device potentially able to measure a 60 nm by 60 nm area. Improvements in lithography techniques that will accompany any improvements in areal density will make even smaller areas of high sensitivity possible.

However larger separations may also be of advantage if low cost or other applications with much lower resolution are considered. Thus the typical voltage to current lead separation measured edge to edge should be in the range of 30 nm and 3 µm. Of course the length of the sensor L will also be determined by this separation and will approximately be about 10-30 times larger than the edge-to edge separation of the voltage leads and second current lead. The length of the sensor would typically be in the range 300 nm to 90 µm., but can be as large as millimeters for some sensor applications.

It should be appreciated that the materials making up the sensor can be such that the current flow between the current leads 314, 316 is primarily by charge carriers that are electrons or can be chosen so that the charge carriers are primarily holes. In addition, as mentioned above the current flow can be in either direction between the leads 314, 316.

A method that can ensure the proper placement of the voltage leads relative to the current leads is to define the semiconductor layer 304, electrically conductive layer 302 and the leads 314, 316, 318, 320 in a single masking making all features from the same material. In this manner the voltage and current probes are self aligned. After patterning of the sensor 300 further lead layers can be aligned to the sensor structure 300. It is understood that other methods for forming the sensor can be employed.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor, comprising:
a layer of electrically conductive material;
a layer of semi-conductor material formed adjacent to and contacting the layer of electrically conductive material, the layer of semi-conductor material having an edge surface opposite the non-magnetic electrically conductive material and having first and second ends separated by a length (L);
first and second electrically conductive current leads, in electrical communication with the semi-conductor material; and
first and second electrically conductive voltage leads in electrical communication with the semiconductor material, the second current lead being located between the first and second voltage leads, and wherein the first and second voltage leads are each separated from the second current lead by a distance no greater than L/20.

2. A sensor as in claim 1 wherein the first and second voltage leads are each separated from the second current lead by a distance of about the size of the magnetic region or bit to be resolved or imaged.

3. A sensor as in claim 1 wherein the second current lead is located a distance 2L/3 from one of the first and second ends of the layer of semi-conductor material.

4. A sensor as in claim 1 wherein the second current lead is located a distance greater than L/3 and less than 5L/6 from one of the first and second ends of the layer of semi-conductor material.

5. A sensor as in claim 1 wherein the layer of semiconductor material has a width (W) in a direction perpendicular to the length (L), and wherein the ratio of W/L, is between L/10 and L/30.

6. A sensor as in claim 1 wherein the layer of semiconductor material has a width (W) in a direction perpendicular to the length (L), and wherein the ratio of W/L is between 1/5 and 1/60.

7. A magnetoresistive sensor, comprising:
a layer of non-magnetic, highly electrically conductive material;
a layer of semi-conductor material formed adjacent to and contacting the layer of electrically conductive material, the layer of semi-conductor material having an edge surface opposite the non-magnetic electrically conductive material and having first and second ends separated by a length (L);
first and second electrically conductive current leads, in electrical communication with the semi-conductive material; and
first and second electrically conductive voltage leads in electrical communication with the semiconductor material, the second current lead being located between the first and second voltage leads, and wherein the first and second voltage leads are each separated from one another by a distance less than L/5.

8. A sensor as in claim 7 wherein the second current lead is located a distance greater than L/3 and less than 5L/6 from one of the first and second ends of the layer of semi-conductor material.

9. A sensor as in claim 7 wherein the second lead is located distance of about 2L/3 from one of the first and second ends of the layer of semi-conductor material.

10. A sensor as in claim 7 wherein the layer of semiconductor material has a width (W) in a direction perpendicular to the length (L), and wherein the ratio of W/L is between 1/5 and 1/60.

11. A sensor as in claim 7 wherein the layer of semiconductor material has a width (W) in a direction perpendicular to ti e length (L), and wherein the ratio of W/L is between L/10 and L/30.

12. A sensor as in claim 7 further comprising a magnetic shield disposed adjacent to the semiconductor layer and the electrically conductive layer.

13. A sensor as in claim 7 wherein the sensor does not include a magnetic shield.

14. A sensor as in claim 7 wherein the semiconductor is a high mobility, small bandgap material.

15. A sensor as in claim 7 wherein the semiconductor is a modulation doped semiconductor involving a 2DEG quantum well, and wherein the layer of highly electrically conductive material comprises a metal.

16. A sensor as in claim 7 wherein the layer of semiconductor material and the layer of electrically conductive material form an Ohmic interface there between.

17. A sensor as in claim 7 further comprising a layer of material intercalated between the layer of semiconductor material and the layer of electrically conductive material to form an Ohmic contact between the layer of semiconductor material and the layer of electrically conductive material.

18. A magnetic data recording system, comprising:
a magnetic medium;
an actuator;
a slider connected with the actuator, the actuator being operable to move the slider over desired locations adjacent to the magnetic medium; and
a magnetoresistive sensor connected with the slider, the sensor further comprising:
a layer of non-magnetic, electrically conductive material;
a layer of semi-conductor material formed adjacent to and contacting the layer of electrically conductive material, the layer of semi-conductor material having an edge surface opposite the non-magnetic electrically conductive material and having first and second ends separated by a length (L);
first and second electrically conductive current leads in electrical communication with the semi-conductive material; and
first and second electrically conductive voltage leads in electrical communication with the semiconductor material, the second current lead being located between the first and second voltage leads, and wherein the first and second voltage leads are each separated from one another by a distance less than L/5.

19. A scanning magnetometer, comprising:
a chuck for holding a workpiece;
an actuator; and
a magnetoresistive sensor connected with the actuator for movement over the chuck, the sensor further comprising:
a layer of non-magnetic, electrically conductive material;
a layer of semi-conductor material formed adjacent to and contacting the layer of electrically conductive material, the layer of semi-conductor material having an edge surface opposite the non-magnetic electrically conductive material and having first and second ends separated by a length (L);
first and second electrically conductive current leads in electrical communication with the semi-conductive material; and
first and second electrically conductive voltage leads in electrical communication with the semiconductor material, the second current lead being located between the first and second voltage leads, and wherein the first and second voltage leads are each separated from one another by a distance less than L/5.

20. A scanning magnetic imaging device, comprising:
a chuck for holding a workpiece;
an actuator; and
a magnetoresistive sensor connected with the actuator for movement over the chuck, the sensor further comprising:
a layer of non-magnetic, electrically conductive material;
a layer of semi-conductor material formed adjacent to and contacting the layer of electrically conductive material, the layer of semi-conductor material having an edge surface opposite the non-magnetic electrically conductive material and having first and second ends separated by a length (L);
first and second electrically conductive current leads in electrical communication with the semi-conductive material; and
first and second electrically conductive voltage leads in electrical communication with the semiconductor material, the second current lead being located between the first and second voltage leads, and wherein the first and second voltage leads are each separated from one another by a distance less than L/5.

21. A magnetoresistive sensor, comprising:
a layer of electrically conductive material;
a layer of semi-conductor material formed adjacent to and contacting the layer of electrically conductive material, the layer of semi-conductor material having an edge surface opposite the non-magnetic electrically conductive material and having first and second ends separated by a length (L);
first and second electrically conductive current leads, in electrical communication with the semi-conductor material; and
first and second electrically conductive voltage leads in electrical communication with the semiconductor material, the second current lead being located between the first and second voltage leads, and wherein the first and second voltage leads are each separated from the second current lead by a distance no greater than 30 nm.

22. A magnetoresistive sensor, comprising:
a layer of electrically conductive material;
a layer of semi-conductor material formed adjacent to and contacting the layer of electrically conductive material, the layer of semi-conductor material having an edge surface opposite the non-magnetic electrically conductive material and having first and second ends separated by a length (L);
first and second electrically conductive current leads, in electrical communication with the semiconductor material; and
first and second electrically conductive voltage leads in electrical communication with the semiconductor material, the second current lead being located between the first and second voltage leads, and wherein the first and second voltage leads are each separated from the second current lead by a distance no greater than 20 nm.

* * * * *

UNITED STATES PATENT AND TRADEMARK OFFICE
CERTIFICATE OF CORRECTION

PATENT NO. : 7,295,406 B2
APPLICATION NO. : 10/897454
DATED : November 13, 2007
INVENTOR(S) : Chattopadhyay et al.

It is certified that error appears in the above-identified patent and that said Letters Patent is hereby corrected as shown below:

In claim 11, column 10, line 63, replace "ti e" with --the--.

Signed and Sealed this

Twentieth Day of July, 2010

David J. Kappos
*Director of the United States Patent and Trademark Office*